(12) United States Patent
Zhang et al.

(10) Patent No.: US 9,892,675 B2
(45) Date of Patent: Feb. 13, 2018

(54) ORGANIC LIGHT-EMITTING DIODE DISPLAY APPARATUS, DISPLAY DEVICE, AND METHOD FOR TESTING THE ORGANIC LIGHT-EMITTING DIODE DISPLAY APPARATUS

(71) Applicant: BOE TECHNOLOGY GROUP CO., LTD., Beijing (CN)

(72) Inventors: Chen Zhang, Beijing (CN); Fei Yang, Beijing (CN); Dongfang Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 52 days.

(21) Appl. No.: 14/769,757

(22) PCT Filed: Nov. 12, 2014

(86) PCT No.: PCT/CN2014/090880
§ 371 (c)(1),
(2) Date: Aug. 21, 2015

(87) PCT Pub. No.: WO2016/026220
PCT Pub. Date: Feb. 25, 2016

(65) Prior Publication Data
US 2016/0293100 A1 Oct. 6, 2016

(30) Foreign Application Priority Data
Aug. 18, 2014 (CN) .......................... 2014 1 0406612

(51) Int. Cl.
*G09G 3/32* (2016.01)
*G09G 3/3225* (2016.01)
(Continued)

(52) U.S. Cl.
CPC ........... *G09G 3/3225* (2013.01); *G01R 31/44* (2013.01); *G09G 3/32* (2013.01); *H01L 27/3244* (2013.01);
(Continued)

(58) Field of Classification Search
CPC .... G09G 3/3225; G09G 3/32; H01L 27/3244; H01L 27/3269; G01R 31/44
(Continued)

(56) References Cited

U.S. PATENT DOCUMENTS

2005/0205126 A1* 9/2005 Okui ................. H01L 31/02242
136/250
2006/0087247 A1* 4/2006 Malmberg ............. G09G 3/006
315/169.2
(Continued)

FOREIGN PATENT DOCUMENTS

| CN | 1627811 A | 6/2005 |
|---|---|---|
| CN | 101044541 A | 9/2007 |

(Continued)

OTHER PUBLICATIONS

First Office Action regarding Chinese application No. 201410406612.0, dated Jul. 28, 2016. Translation provided by Dragon Intellectual Property Law Firm.
(Continued)

*Primary Examiner* — Jeff Natalini
(74) *Attorney, Agent, or Firm* — Harness, Dickey & Pierce, P.L.C.

(57) ABSTRACT

The present disclosure provides an organic light-emitting diode (OLED) display apparatus, including a plurality of subpixels, each of which includes an anode, a cathode and a light-emitting layer. The OLED display apparatus further includes at least one photovoltaic conversion module arranged in correspondence with the subpixel, and config-
(Continued)

ured to receive an optical signal from the light-emitting layer of the corresponding subpixel and convert the received optical signal into an electric signal. A testing terminal is extracted from the photovoltaic conversion module and configured to acquire the electric signal converted by the photovoltaic conversion module.

11 Claims, 2 Drawing Sheets

(51) Int. Cl.
G01R 31/44 (2006.01)
H01L 27/32 (2006.01)
(52) U.S. Cl.
CPC ... *H01L 27/3269* (2013.01); *G09G 2360/148* (2013.01)
(58) Field of Classification Search
USPC .................................. 324/404–414, 760.01
See application file for complete search history.

(56) References Cited

U.S. PATENT DOCUMENTS

| | | | |
|---|---|---|---|
| 2006/0145365 A1* | 7/2006 | Halls | B82Y 10/00 347/238 |
| 2006/0214890 A1* | 9/2006 | Morishige | G09G 3/325 345/77 |
| 2007/0170839 A1* | 7/2007 | Choi | C03C 8/24 313/500 |
| 2008/0237766 A1* | 10/2008 | Kim | H01L 27/14627 257/432 |
| 2009/0147032 A1* | 6/2009 | Kim | G09G 3/3225 345/690 |
| 2011/0267324 A1* | 11/2011 | Stephens | G09G 3/3611 345/207 |
| 2012/0001207 A1* | 1/2012 | Lee | H01L 51/5265 257/89 |

FOREIGN PATENT DOCUMENTS

| | | |
|---|---|---|
| CN | 202404870 U | 8/2012 |
| CN | 202443212 U | 9/2012 |
| CN | 103267627 A | 8/2013 |
| CN | 103413522 A | 11/2013 |
| CN | 203351177 U | 12/2013 |
| CN | 103575507 A | 2/2014 |
| CN | 103728753 A | 4/2014 |
| CN | 103760483 A | 4/2014 |
| CN | 103762263 A | 4/2014 |
| DE | 10244452 A1 | 4/2004 |
| JP | 2010198849 A | 9/2010 |
| KR | 20060037728 A | 5/2006 |

OTHER PUBLICATIONS

Written Opinion of the International Searching Authority for international application No. PCT/CN2014/090880.

* cited by examiner

US 9,892,675 B2

ORGANIC LIGHT-EMITTING DIODE DISPLAY APPARATUS, DISPLAY DEVICE, AND METHOD FOR TESTING THE ORGANIC LIGHT-EMITTING DIODE DISPLAY APPARATUS

CROSS-REFERENCE TO RELATED APPLICATION

This application is the U.S. national phase of PCT Application No. PCT/CN2014/090880 filed on Nov. 12, 2014, which claims a priority of the Chinese Patent Application No. 201410406612.0 filed on Aug. 18, 2014, the disclosures of which are incorporated in their entirety by reference herein.

TECHNICAL FIELD

The present disclosure relates to the field of display technology, in particular to an organic light-emitting diode (OLED) display apparatus, a display device, and a method for testing the OLED display apparatus.

BACKGROUND

OLED has been regarded as an emerging technology for a next-generation flat-panel display due to its characteristics such as self-luminescence, being free of backlight source, high contrast, being thin, a wide viewing angle, rapid response, being applicable to a flexible panel and at a wide temperature range, a simple structure and a simple manufacture process. For an OLED apparatus, sometimes it is required to measure its optical characteristics.

For an existing optical test, an optical measurement instrument is usually used to measure optical data at a specified region of a panel and the other data, e.g., a current flowing through a light-emitting layer (EL), so as to estimate the luminescence efficiency of a material of the EL and the light-emission evenness of the entire panel. However, it is impossible for such a testing method to directly and accurately obtain the desired data, i.e., there is a relatively great error in the testing method. As a result, it is unable to accurately acquire the optical characteristics of the EL.

SUMMARY

An object of the present disclosure is to provide an OLED display apparatus, a display device and a method for testing the OLED display apparatus, so as to directly and accurately obtain optical data when performing optical measurement on an OLED panel, thereby to accurately acquire optical characteristics of an light-emitting layer.

In one aspect, the present disclosure provides in one embodiment an OLED display apparatus, including a plurality of subpixels, each of which includes an anode, a cathode and a light-emitting layer. The OLED display apparatus further includes at least one photovoltaic conversion module arranged in correspondence with the subpixel, and configured to receive an optical signal from the light-emitting layer of the corresponding subpixel and convert the received optical signal into an electric signal. A testing terminal is extracted from the photovoltaic conversion module and configured to acquire the electric signal converted by the photovoltaic conversion module.

Alternatively, the OLED display apparatus further includes a control module configured to control a voltage between the anode and the cathode of the corresponding subpixel, so as to control a light-emitting state of the light-emitting layer of the corresponding subpixel.

Alternatively, the OLED display apparatus further includes an energy storage module connected to the testing terminal.

Alternatively, the photovoltaic conversion module includes a PN junction, and an insulating layer is provided at an outer layer of the PN junction.

Alternatively, the subpixels are arranged in a matrix form, and the testing terminals of the photovoltaic conversion modules corresponding to the subpixels in at least one column and/or one row are connected in parallel.

Alternatively, the OLED display apparatus further includes a thin film transistor (TFT) for driving the subpixel, the TFT includes a source electrode, a drain electrode and a gate electrode, and the source or drain electrode is connected to the anode.

Alternatively, the OLED display apparatus further includes a substrate arranged at a side where the gate electrode is located.

Alternatively, a gate insulating layer is arranged between the gate electrode and an active layer.

Alternatively, a planarization layer and an etch stop layer are further arranged between the TFT and the subpixel.

Alternatively, a color filter layer is further arranged at a light-exiting side of the light-emitting layer.

In another aspect, the present disclosure provides in one embodiment a display device including the above-mentioned OLED display apparatus.

In yet another aspect, the present disclosure provides in one embodiment a method for testing an OLED display apparatus, including steps of: when a light-emitting layer in the OLED display apparatus emits light, generating a current through a photovoltaic effect caused after a photovoltaic conversion module of the OLED display apparatus is irradiated by the light; acquiring by a testing terminal extracted from each subpixel the current converted by the photovoltaic conversion module, and steering the current toward an outer side of the OLED display apparatus; controlling a bright state and a dark state of each subpixel by a control circuit, thereby measuring a photovoltaic current for the corresponding subpixel; and determining a current relation according to a material of the light-emitting layer, and calculating an actual value of an optical characteristic of the light-emitting layer according to a theoretical value obtained from the relation and a measured current.

According to the embodiments of the present disclosure, the photovoltaic conversion module is added in an OLED pixel unit, so as to convert optical energy generated by the light-emitting layer into electric energy and collect the electric energy, thereby to save the energy. In addition, the testing terminal is extracted from the photovoltaic conversion module, so as to acquire a value of the converted electric signal and calculate an actual value of the optical characteristic of the OLED according to the value of the electric signal, thereby to accurately measure the optical characteristic of the light-emitting layer.

DETAILED DESCRIPTION

In order to make the objects, the technical solutions and the advantages of the present disclosure, the present disclosure will be described hereinafter in conjunction with the drawings and embodiments.

Figure 1:
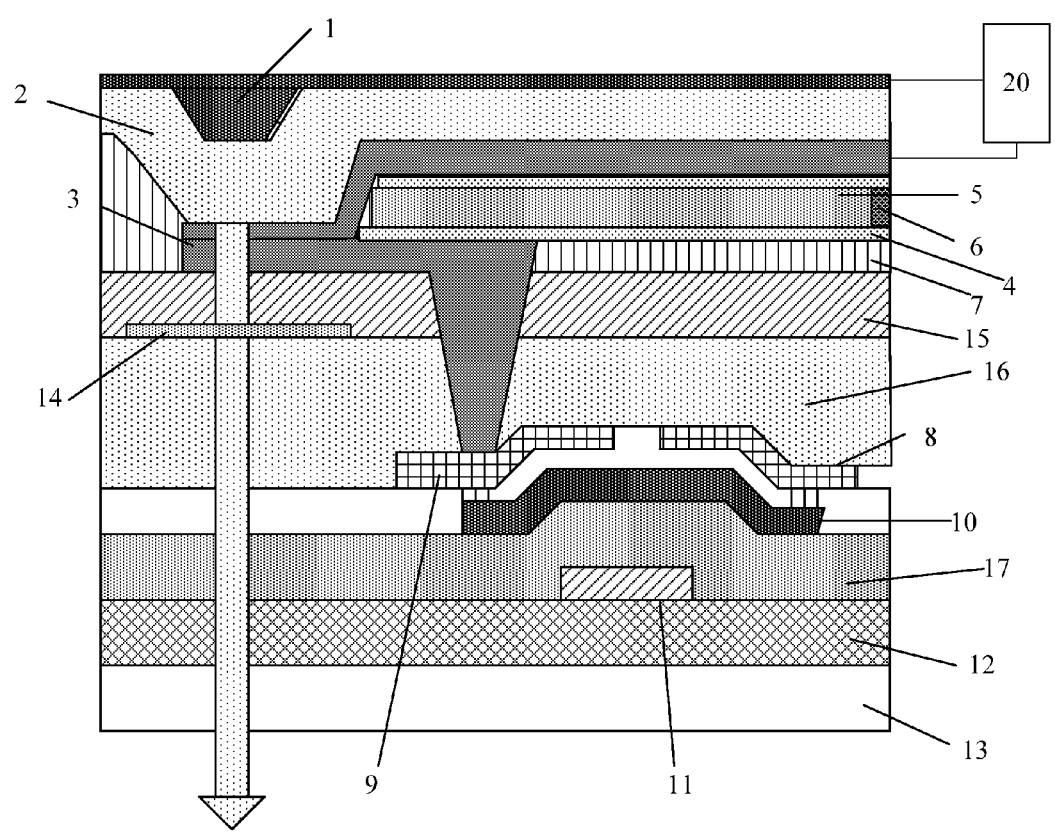
FIG. 1 is a schematic view showing an OLED display apparatus according to one embodiment of the present disclosure.

As shown in FIG. 1, which is a schematic view showing an OLED display apparatus according to one embodiment of the present disclosure, the OLED display apparatus includes a plurality of subpixels, each of which includes an anode 3, a cathode 1 and a light-emitting layer 2 arranged therebetween. The OLED display apparatus further include at least one photovoltaic conversion module arranged in correspondence with the subpixel, and configured to receive an optical signal from the light-emitting layer of the corresponding subpixel and convert the received optical signal into an electric signal. A testing terminal 6 is extracted from the photovoltaic conversion module and configured to acquire the electric signal converted by the photovoltaic conversion module.

According to the embodiments of the present disclosure, the photovoltaic conversion module is added in an OLED pixel unit, so as to convert optical energy generated by the light-emitting layer into electric energy and collect the electric energy, thereby to save the energy. In addition, the testing terminal is extracted from the photovoltaic conversion module, so as to acquire a value of the converted electric signal and calculate an actual value of the optical characteristic of the OLED according to the value of the electric signal, thereby to accurately measure the optical characteristic of the light-emitting layer.

Referring again to FIG. 1, the photovoltaic conversion module includes a PN junction 5 and an insulating layer 4 arranged at both sides of the PN junction. The PN junction 5 absorbs the light from the light-emitting layer, and converts it into electric energy. The testing terminal 6 is connected to the PN junction. The insulating layer 4 and the anode 3 are transparent or semi-transparent, so that the light from the light-emitting layer can be absorbed by the PN junction 5. In the embodiments of the present disclosure, each subpixel is provided with a photovoltaic conversion module and a testing terminal 6 for testing the value of the electric signal converted by the photovoltaic conversion module. Because the light-emitting state of each subpixel may be controlled, it is able to detect the value of the electric signal converted by any one of the photovoltaic conversion modules.

The OLED display apparatus may detect the value of the electric signal through an external detection module, e.g., an ampere meter. The OLED display apparatus further includes a control module 20 configured to control a voltage between the anode and the cathode of the corresponding subpixel, so as to control a light-emitting state of the light-emitting layer of the corresponding subpixel.

Figure 2:
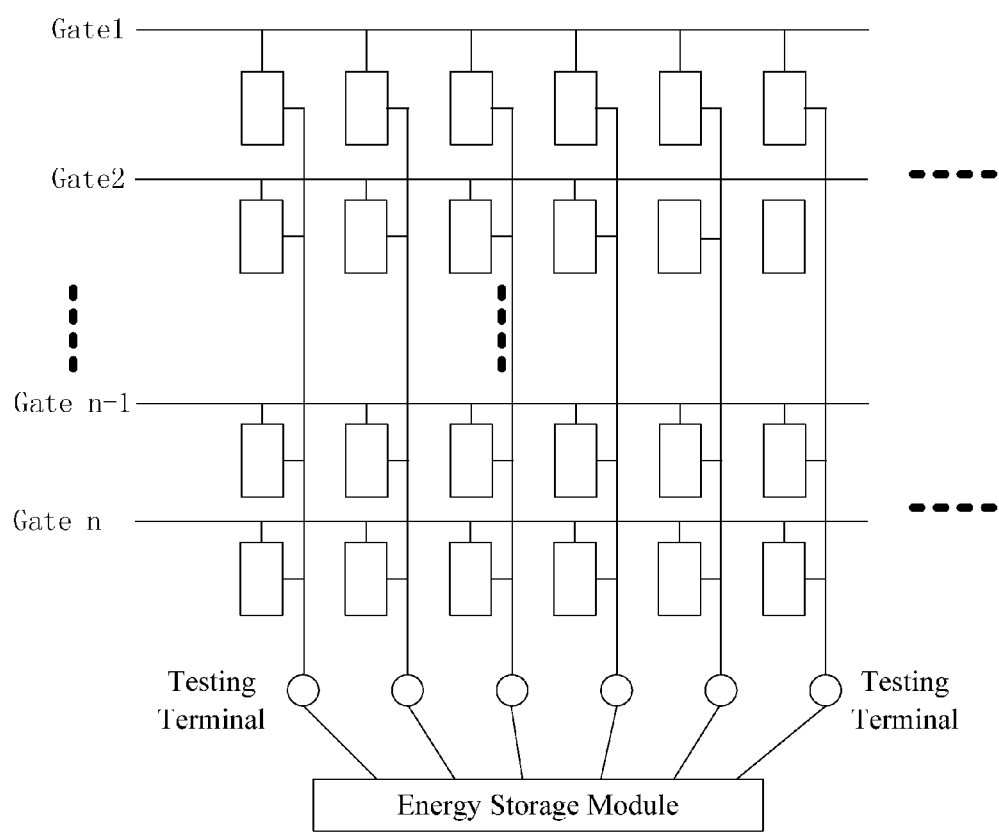
FIG. 2 is a schematic view showing the principle of testing the OLED display apparatus according to one embodiment of the present disclosure.

When the light-emitting layer of the OLED display apparatus emits light, a photovoltaic effect may occur after the photovoltaic conversion module is irradiated by the light and a current may thus be generated. The current is then steered by the testing terminal to an outer side of the display apparatus. The photovoltaic current for the corresponding subpixel may be measured by controlling a bright state and a dark state of each subpixel with a control circuit. FIG. 2 shows one of the control methods, where the bright state and the dark state of the subpixels in each column are controlled so as to measure a current I for the corresponding subpixels in each column. At this time, $I \sim f(\rho)$, $I \sim f(\lambda)$ and $I \sim f(hv)$, wherein $\rho$ represents the photovoltaic conversion efficiency, $\lambda$ is a wavelength of the light, and $hv$ represents the optical energy of the light. The relationship between the current and each of the above three functions vary along with a material of the light-emitting layer and a light spectrum.

FIG. 2 is a schematic view showing the principle of testing the OLED display apparatus. As shown in FIGS. 1 and 2, the light-emitting layer is arranged at a pixel region (PDL) 7 defined by data lines and gate lines that are arranged in a crisscross manner, and the gate lines Gate 1 to Gate n are configured to control the light-emitting states of each subpixel. When measuring the optical characteristic of the light-emitting layer, the above relations may be determined in accordance with the material of the light-emitting layer, and a desired theoretical value may be obtained. At this time, the actual value of the optical characteristic may be calculated according to the relations and a measured current. For example, the subpixels in previous 100 columns may be controlled by a circuit to emit light, and the other subpixels do not emit light. At this time, the photovoltaic currents generated by the subpixels in the previous 100 columns are measured, so as to obtain such data as the light-emitting efficiency of the light-emitting layers of the subpixels in these 100 columns. Because the optical characteristics of the light-emitting layers of the subpixels may be acquired, it is able to make corresponding adjustment in accordance with these optical characteristics, thereby to further improve the quality of the OLED panel.

Referring again to FIG. 2, the OLED display apparatus further includes an energy storage module connected to the testing terminal and configured to store the converted current. The subpixels are arranged in a matrix form, and the testing terminals of the photovoltaic conversion modules corresponding to the subpixels in at least one column and/or one row are connected in parallel. At this time, it is able to detect the currents for the subpixels in one or more rows/columns, thereby to obtain the optical characteristics of the light-emitting layers of the corresponding subpixels in accordance with the current stored in the energy storage module.

Referring again to FIG. 1, the OLED display apparatus further includes a TFT connected to the anode and configured to control a voltage of the subpixel. The TFT includes a source electrode 8, a drain electrode 9, an active layer 10, a gate electrode 11 and a gate insulating layer 17. The drain electrode 9 of the TFT is connected to the anode 3, and the gate insulating layer 17 is arranged between the gate electrode 11 and the active layer 10. An etch stop layer 16 and a planarization layer 15 are arranged between the TFT and a layer of the subpixels. The gate electrode 11 is arranged on a substrate 12, and a reinforcement layer 13 is arranged at a light-existing side of the substrate 12 for increasing the light output efficiency. Further, a color filter layer 14 is arranged at a light-exiting side of the light-emitting layer and at a surface of the planarization layer 15.

The present disclosure further provides in one embodiment a display device including the above-mentioned OLED display apparatus. The display device may be any product or member having a display function, such as a liquid crystal panel, an electronic paper, an OLED panel, a mobile phone, a flat-panel PC, a TV, a display, a lap-top PC, a digital photo frame or a navigator.

The present disclosure further provides in one embodiment a method for testing the OLED display apparatus, including steps of: when the light-emitting layer in the OLED display apparatus emits light, generating a current through the photovoltaic effect caused after the photovoltaic conversion module of the OLED display apparatus is irradiated by the light; acquiring by the testing terminal extracted from each subpixel the current converted by the photovoltaic conversion module, and steering the current toward the outer side of the OLED display apparatus; controlling the bright state and the dark state of each subpixel by a control circuit, thereby measuring a photovoltaic current for the corresponding subpixel; and determining a current relation according to the material of the light-emitting layer, and calculating the actual value of the optical characteristic of the light-emitting layer according to the theoretical value obtained from the relation and the measured current.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. An organic light-emitting diode (OLED) display apparatus, comprising a plurality of subpixels, each of which comprises an anode, a cathode, and a light-emitting layer, wherein:
    a first subpixel of the plurality of subpixels further comprises:
        a substrate,
        a thin film transistor (TFT) located above the substrate, for driving the first subpixel,
        a planarization layer located above the TFT,
        a photovoltaic conversion module arranged between the planarization layer and the anode, and
        a testing terminal;
    the TFT includes:
        a gate electrode,
        a gate insulating layer,
        an active layer,
        a source electrode, and
        a drain electrode;
    the drain electrode is connected to the anode through a via hole;
    the light-emitting layer is located between the anode and the cathode;
    the photovoltaic conversion module includes:
        a PN junction configured to receive an optical signal from the light-emitting layer of the first subpixel and convert the received optical signal into an electric signal, and
        insulating layers arranged at both sides of the PN junction; and
    the testing terminal is (i) connected to the PN junction, (ii) extracted from the photovoltaic conversion module, and (iii) configured to acquire the electric signal converted by the photovoltaic conversion module.

2. The OLED display apparatus according to claim 1, further comprising a control module, configured to control a voltage between the anode and the cathode of the first subpixel, so as to control a light-emitting state of the light-emitting layer of the first subpixel.

3. The OLED display apparatus according to claim 2, further comprising an energy storage module connected to the testing terminal.

4. The OLED display apparatus according to claim 2, wherein the subpixels are arranged in a matrix form, and testing terminals of photovoltaic conversion modules corresponding to subpixels in at least one column and/or one row are connected in parallel.

5. The OLED display apparatus according to claim 1, further comprising an energy storage module connected to the testing terminal.

6. The OLED display apparatus according to claim 5, wherein the subpixels are arranged in a matrix form, and testing terminals of photovoltaic conversion modules corresponding to subpixels in at least one column and/or one row are connected in parallel.

7. The OLED display apparatus according to claim 1, wherein the subpixels are arranged in a matrix form, and testing terminals of photovoltaic conversion modules corresponding to subpixels in at least one column and/or one row are connected in parallel.

8. The OLED display apparatus according to claim 1, wherein the first subpixel further comprises an etch stop layer arranged between the gate insulating layer and the planarization layer.

9. The OLED display apparatus according to claim 1, wherein a color filter layer is further arranged at a light-exiting side of the light-emitting layer.

10. A display device comprising the organic light-emitting diode (OLED) display apparatus according to claim 1.

11. A method for testing an organic light-emitting diode (OLED) display apparatus that includes a plurality of subpixels, wherein each subpixel of the plurality of subpixels includes an anode, a cathode, and a light-emitting layer; wherein a first subpixel of the plurality of subpixels further includes a substrate, a thin film transistor (TFT) located above the substrate, a planarization layer located above the TFT, a photovoltaic conversion module arranged between the planarization layer and the anode, and a testing terminal; wherein the TFT includes a gate electrode, a gate insulating layer, an active layer, a source electrode, and a drain electrode; wherein the drain electrode is connected to the anode through a via hole; wherein the light-emitting layer is located between the anode and the cathode; wherein the photovoltaic conversion module includes a PN junction configured to receive an optical signal from the light-emitting layer of the first subpixel and convert the received optical signal into an electric signal, and insulating layers arranged at both sides of the PN junction, and wherein the testing terminal is (i) connected to the PN junction, (ii) extracted from the photovoltaic conversion module, and (iii) configured to acquire the electric signal converted by the photovoltaic conversion module, the method comprising:
    in response to the light-emitting layer in the OLED display apparatus emitting light, generating a current through a photovoltaic effect in response to the photovoltaic conversion module being irradiated by the light;
    acquiring, by the testing terminal extracted from the first subpixel, the current generated by the photovoltaic conversion module, and steering the current toward an outer side of the OLED display apparatus;
    controlling a bright state and a dark state of each subpixel by a control circuit, thereby measuring a photovoltaic current for the first subpixel;
    determining a current relation according to a material of the light-emitting layer; and
    calculating an actual value of an optical characteristic of the light-emitting layer according to a theoretical value obtained from the relation and a measured current.

* * * * *